(12) United States Patent
Bertora et al.

(10) Patent No.: US 8,849,363 B2
(45) Date of Patent: Sep. 30, 2014

(54) OPEN-STRUCTURE MAGNETIC ASSEMBLY FOR MAGNETIC RESONANCE IMAGING (75) Inventors: Franco Bertora, Genoa (IT); Elisa Molinari, Genoa (IT); Andrea Viale, Genoa (IT); Giulio Sandini, Genoa (IT)

(73) Assignee: Fondazione Istituto Italiano di Technologia, Genoa (IT)

( * ) Notice: Subject to any disclaimer, the term of this patent is extended or adjusted under 35 U.S.C. 154(b) by 116 days.

(21) Appl. No.: 13/501,680

(22) PCT Filed: Oct. 18, 2010

(86) PCT No.: PCT/IB2010/054705
§ 371 (c)(1),
(2), (4) Date: Apr. 12, 2012

(87) PCT Pub. No.: WO2011/048537
PCT Pub. Date: Apr. 28, 2011

(65) Prior Publication Data
US 2012/0202696 A1    Aug. 9, 2012

(30) Foreign Application Priority Data
Oct. 19, 2009   (IT) .............................. TO2009A0789

(51) Int. Cl.
| G01R 33/035 | (2006.01) |
| G01R 33/3873 | (2006.01) |
| G01R 33/38 | (2006.01) |
| G01R 33/381 | (2006.01) |
| G01R 33/383 | (2006.01) |
| G01R 33/3815 | (2006.01) |

(52) U.S. Cl.
CPC ........ *G01R 33/3806* (2013.01); *G01R 33/3873* (2013.01); *G01R 33/3815* (2013.01); *G01R 33/381* (2013.01); *G01R 33/383* (2013.01)
USPC ........................................................ 505/162

(58) Field of Classification Search
USPC .................................... 505/162, 160; 324/320
See application file for complete search history.

(56) References Cited

U.S. PATENT DOCUMENTS

| 4,701,736 A | 10/1987 | McDougall et al. |
| 5,305,749 A * | 4/1994 | Li et al. .......................... 600/415 |

(Continued)

FOREIGN PATENT DOCUMENTS

| EP | 0 626 587 A1 | 11/1994 |
| EP | 0 694 789 A1 | 1/1996 |

OTHER PUBLICATIONS

European Office Action for corresponding European Patent Application No. 10773152.3 mailed May 13, 2013.
International Search Report for corresponding International Patent Application No. PCT/IB2010/054705 mailed Mar. 15, 2011.

(Continued)

*Primary Examiner* — Colleen Dunn
(74) *Attorney, Agent, or Firm* — Merchant & Gould P.C.

(57) ABSTRACT

An open-structure magnetic assembly is adapted to generate a homogeneous magnetic field in an accessible space region, including a first and second independent source of magnetic field (10, 12), each generating a contribution to the resulting magnetic field. The first source includes a conducting or superconducting plate (20), carrying an unidirectional current flow (I) from an input side (22) to an output side (24) and at least one external current recirculating path (30) between the output side (24) and the input side (22) of the plate. The second source includes a volume of magnetized material or an arrangement of coils, arranged for generating a magnetic field component oriented according to the magnetic field generated by the first source (10), and whose intensity exhibits a gradient in a direction perpendicular to the conducting plate (20) adapted to compensate, in a region of interest, an opposite gradient in the magnetic field intensity generated by the first source (10).

8 Claims, 6 Drawing Sheets

(56) References Cited

U.S. PATENT DOCUMENTS 5,428,292 A     6/1995  Dorri et al.
5,592,090 A *   1/1997  Pissanetzky .................. 324/369

OTHER PUBLICATIONS

Pulyer, Y. et al. "Generation of Remote Homogeneous Magnetic Fields", IEEE Transactions on Magnetics, IEEE Service Center, New York, NY, vol. 38, No. 3, May 1, 2002, pp. 1553-1563.

* cited by examiner

OPEN-STRUCTURE MAGNETIC ASSEMBLY FOR MAGNETIC RESONANCE IMAGING

This application is a National Stage Application of PCT/IB2010/054705, filed 18 Oct. 2010, which claims benefit of Ser. No. TO2009A000789, filed 19 Oct. 2009 in Italy and which applications are incorporated herein by reference. To the extent appropriate, a claim of priority is made to each of the above disclosed applications.

BACKGROUND OF THE INVENTION

The present invention relates to the generation of magnetic fields, in particular for magnetic resonance imaging.

Magnetic Resonance Imaging (MRI) requires a high strength and uniformity magnetic field over a region of interest. In case of imaging of human subjects, it is also necessary that the shape of the magnet be suitable for easy positioning of the subject under examination, so that the volume to be examined is located in the region of homogeneous field, i.e. in the region where the magnetic field exhibits equal intensity and is unidirectional.

Electromagnetic fields are described by Maxwell's equations, which do not allow the existence of uniform fields in air, except in volumes completely enclosed within elements generating said fields. In general, however, the magnet cavity is designed to position the subject to be examined. Therefore the possibility of building a magnet able to generate a perfectly homogeneous field and simultaneously exhibiting openings suitable to position a subject is a priori excluded.

Therefore the art of manufacturing magnets suitable for MRI has been focused on finding techniques able to best approximate the required conditions, using magnetic field generators formed by conductive coils, carrying direct electric currents, or by blocks of magnetized materials. A number of techniques are used in the context, and they differ substantially if the field is generated by windings or by blocks of magnetized materials. From a fundamental point of view, anyway, the physical principles are the same.

The current state of the art in the field of MRI requires field intensities in the range from a minimum of 1 Tesla up to 8 or 9 Tesla. The most common structure of a magnetic field generator for MRI applications is a set of circular coils wound around different diameters and with different axial spacings along a single cylindrical symmetry axis. A proper choice of coil size and location enables the generation of fields having the features of intensity and homogeneity required over the volume of interest, which is located near the center of the structure. Moreover, the use of external coils wherein the current flows in opposite direction with respect to the internal coils enables "shielding", i.e. reducing the field in regions where it is not necessary (or even harmful).

According to this structural choice, the magnet is shaped as a cylinder, and the subject is positioned inside said cylinder. The region of imaging is near the center of the cylinder, therefore it is hardly accessible from the outside. Since in the imaging region it is often positioned the head, or the chest, or the waist of the subject (for brain, or cardiac, or abdominal examinations respectively), the subject is enclosed in the cylindrical volume of the magnet, which leads to conditions of anxiety, discomfort or real claustrophobia, which make the examination impossible in a significant fraction of the cases.

Another structure that is employed is the "open" configuration in which an iron core comprising two circular or otherwise shaped pole pieces is excited by means of coils or of permanently magnetized material. This kind of magnets is limited in the maximum field intensity that can be reached either by the maximum remanence of the available permanent magnets or by the saturation characteristics of the iron constituting the core.

Still another "open" structure is based on the "split coil" or "Helmholtz coil" configuration in which two coaxial coils are spaced apart thus providing a space for introducing the patient in a direction orthogonal to the axis of the coils; in an alternate implementation the patient lies along the axis of the coils and the gap between them is used by a surgeon to access the patient body.

The design and manufacturing techniques for permanent magnets (i.e. based on the use of magnetized materials) are quite different. A permanent magnet can be manufactured by a combination of polyhedral blocks of a magnetized material, which has the property of generating a perfectly uniform field in a cavity inside the magnet when the cavity is completely enclosed. Removing a wall from the cavity causes a significant degradation of the field properties, which must be corrected by adding auxiliary blocks, suitably sized and positioned.

The use of permanent magnetic materials poses however some limits on the maximum achievable field intensity, which currently is about 0.5 to 0.8 Tesla, therefore below the levels currently provided by superconducting magnets.

As a consequence, the generation of a uniform magnetic field in a region of interest within a cavity or in a volume of open space, accessible to a patient, is generally achieved at the expense of efficiency, which is defined as the ratio between the energy of the magnetic field comprised in the spatial region of interest and the total energy used to generate said field, or otherwise as the ratio between the magnetic field intensity in the spatial region of interest and the peak current density flowing in the coils which generate said field.

According to the magnetic field theory, a region of uniform magnetic field in a volume free from electric currents (as is the region of interest for the applications here considered) can exist only around a saddle point. This is a consequence of the fact that maxima or minima of the field cannot exist in a volume of space free from electric currents. Moreover, the field intensity decreases when the distance from the generating currents increases.

The theoretical and practical problem of designing an open magnet therefore corresponds to the problem of determining a configuration suitable to generate a saddle point of the magnetic field in a region as far as possible from the magnetic structure, and therefore accessible, where however the field intensity is still sufficiently high for the desired application.

An overview of the known techniques to generate remote uniform magnetic fields, i.e. fields in spatial regions external to the field generating structure, is reported in the article "Generation of Remote Homogeneous Magnetic Fields" by Yuly M. Pulyer and M. I. Hrovat, published in IEEE Transactions on Magnetics, vol. 38, 2003 (1553). The paper describes the eleven configurations proposed in the literature to generate uniform magnetic fields for magnetic resonance imaging applications, both of open and closed type, and for each said configuration it reports the corresponding dipole-based model which describes schematically the main features of each structure. It is worth noting that all eleven models can be reduced to one or more dipoles of variable intensity, whose vectors are collinear, with either equal or opposite direction, or parallel, in which case they are never co-directionally oriented.

Typical examples of structures for the generation of a magnetic field with the desired properties are the configurations based on separated coils, which include two short solenoids facing each other, oriented either co- or contra-directionally, the configurations based on combinations of flat ("pancake") coaxial coils, which generate different field intensities, or combinations of more complex structures having two or four parallel or antiparallel dipoles.

As a matter of fact, the structures so far practically used in MRI applications are the configurations based on separate coils, or on volume magnets shaped as C or H. U.S. Pat. Nos. 5,592,090 and 5,305,749 both disclose an open-structure magnetic assembly having a single source of magnetic field, in the form of a winding, and a structure of magnetic material for propagating the field excited by the source and establishing a uniform field in a region of a cavity intended for receiving a patient.

A deeper analysis of these structures allows their classification in terms of their "aperture degree", which can be defined quantitatively by means of the aperture factor, defined as the ratio between the solid angle subtended by the total aperture, as seen from the center of the region of interest, and the total solid angle $4\pi$.

It is obvious to a man skilled in the art that the greater is the number of open sides of the structure the lower is the efficiency of a magnetic assembly. For example, a solenoid or "tunnel" magnet is open at the opposite end faces, orthogonal to the direction of the magnetic field vector, while a C-shaped magnet is open at four faces parallel to the field (envelope of the magnet air gap), a "pancake" magnet including flat coaxial coils (as described e.g. in U.S. Pat. Nos. 4,701,736 or 5,428,292) is open at five faces, four parallel and one orthogonal to the field.

Let's consider for example a cylindrical coil (solenoid) with its length equal to its diameter, a C-shaped magnet with a pair of flat pole pieces with a circular cross section, separated by a distance equal to their diameter, and, by comparison, an infinite solenoid having the same diameter. The magnetic field in the region of interest is strictly related to the aperture factor. As a consequence, in a C-shaped magnet the ratio between distance and diameter of the pole pieces must be kept low, typically about 0.5, if a good efficiency is desired. Similarly, a solenoid should be at least 1.5 to 2 diameters long. The corresponding aperture factors would be 0.2929 for the solenoid and 0.7071 for the C-shaped magnet. However, while in a C-shaped magnet structure the field intensity in a median plane has a maximum near its center, in a solenoid structure the situation is opposite and the maximum for the field intensity is close to its inner walls.

From the point of view of efficiency the region of interest should be as close as possible to a wall rather than at the center of a current-free region.

These considerations are however conflicting with the requirements for particular MRI applications, e.g. for the study of the human motor cortex, where there is the need to keep the patient in a natural, erected or seated position, free to move.

SUMMARY OF THE INVENTION

This invention has the object of building an open-structure magnetic assembly, adapted to generate a homogeneous magnetic field in an accessible region of interest, sufficiently close to the magnet structure to achieve high efficiency for said assembly.

It is a further object of this invention an equipment for magnetic resonance imaging, as claimed.

In summary, this invention is based on the principle of generating a homogeneous magnetic field in a region of interest by the addition of fields generated by two main different structures. This is a novel approach, entirely different from the known art, which instead teaches how to correct the distortions caused by opening a single main closed structure generating a uniform field.

BRIEF DESCRIPTION OF THE DRAWINGS

Further features and advantages of the invention will be described more in detail in the following detailed description of a specific embodiment, given as a non-limiting example, with reference to the enclosed drawings, where.

DETAILED DESCRIPTION OF THE PREFERRED EMBODIMENTS

Figure 1:
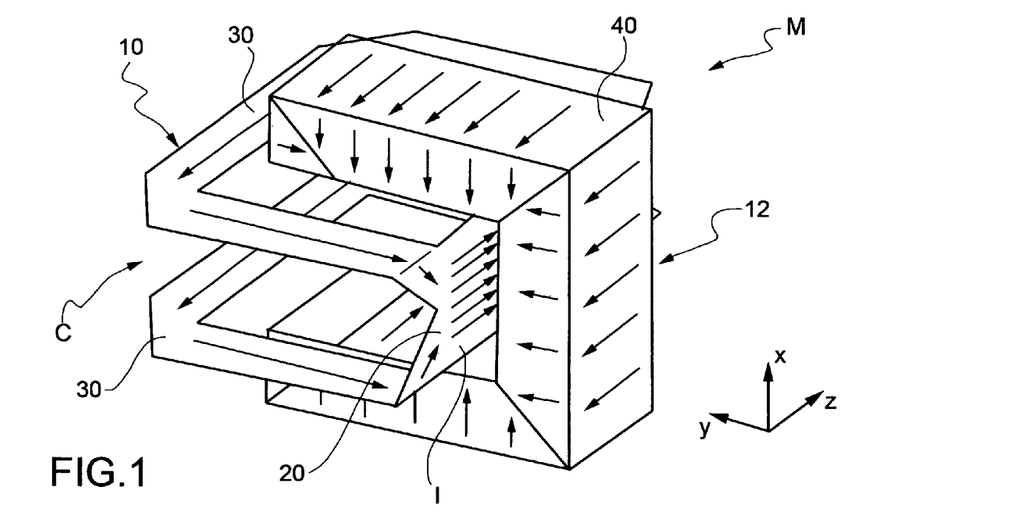
FIG. 1 shows a schematic representation of an embodiment of the magnetic assembly according to the invention.

A magnetic assembly according to the invention, indicated with M, is shown in FIG. 1, and comprises a first source of magnetic field 10 and a second source of magnetic field 12. The first field source 10 includes a current conducting structure, preferably a superconducting one, while the second field source 12 includes a block of magnetized material or a prismatically shaped volume magnet with associated coils of conducting or superconducting material.

The magnetic assembly M defines a magnet cavity C open at three sides, wherein an accessible spatial region of interest is found, and has an overall structure symmetric with respect to a longitudinal median plane of symmetry yz. Both generating sources contribute to the overall field, said contributions being identified in the following as main magnetic field and compensating magnetic field, respectively.

Figure 5:
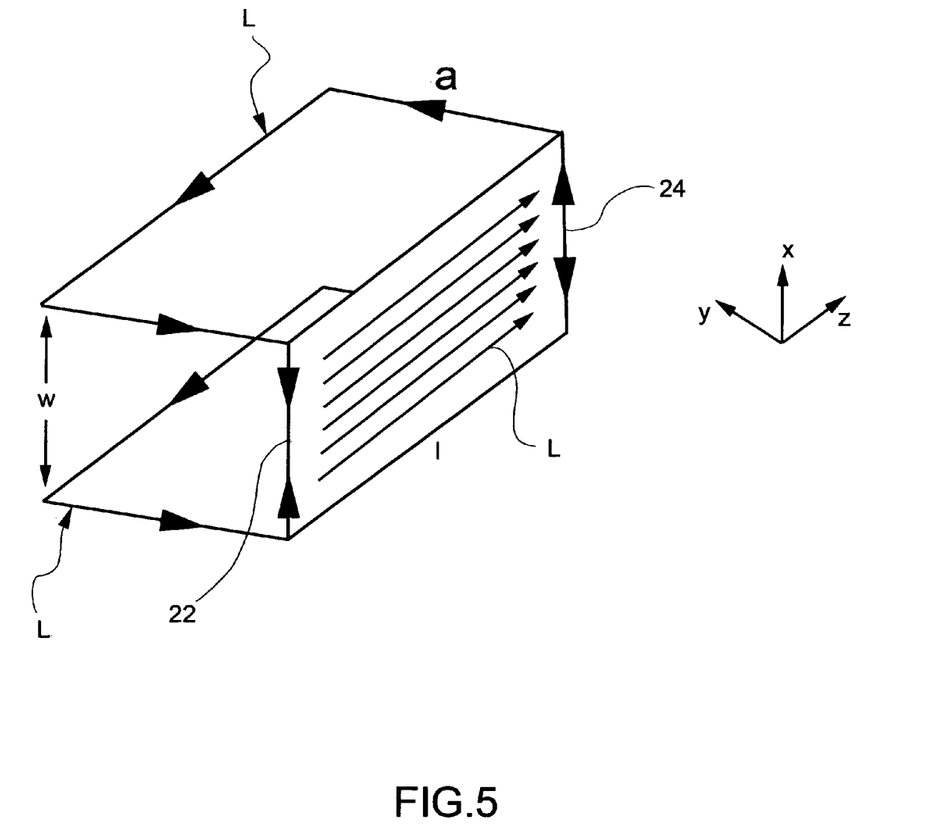
FIG. 5 shows a geometrical representation of a complete current circuit including a finite current sheet and current recirculating paths.

The first source of magnetic field, whose electrical model is shown in FIG. 5, includes a plate or similar two-dimensional structure made of electrically conducting or superconducting material 20, e.g. a Ti—Nb alloy or Mg—B or others exhibiting similar superconducting properties, adapted to carry a unidirectional current I (schematically shown by parallel arrows in the figure) flowing from an input edge 22 to an output edge 24 along a longitudinal direction, so that it can be represented theoretically by a current sheet in an electric model. The current I generates in the spatial region facing the plate a main magnetic field, substantially unidirectional and oriented along a direction parallel to the plate, and rapidly decreasing away from said plate.

A pair of loops 30 for recirculating the current flowing in the plate, located at the sides of the plate symmetrically to the longitudinal median plane of symmetry, connects the output edge 24 of the plate to input edge 22 of the same and closes the current path.

The current recirculating loops 30 are formed each by a conducting or superconducting web, entirely lying in a respective plane orthogonal to the plate and parallel to the direction of current flow.

Figure 2:
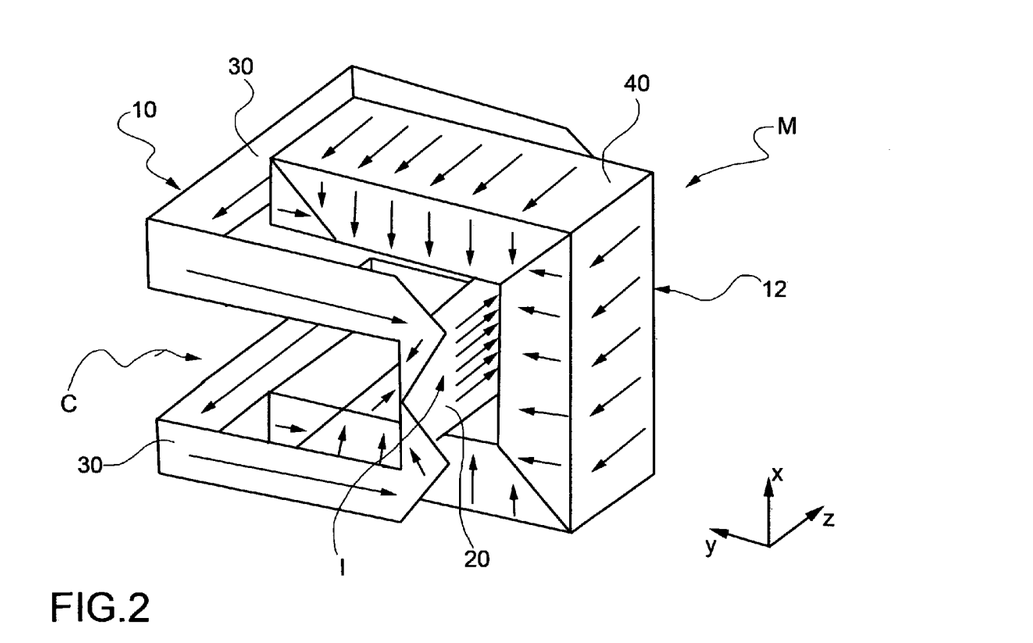
FIG. 2 is a schematic representation of a different embodiment of the magnetic assembly shown in FIG. 1.

In an alternative embodiment, shown in FIG. 2, the current closing loops are formed by a conducting or superconducting web lying on a cylindrical or prismatic surface having its axis parallel to the plate plane and orthogonal to the current flowing direction.

In a further embodiment (not shown) the current recirculating loops are formed by a conducting or superconducting web, and each said loop comprises an initial segment and a terminal segment both lying in a plane orthogonal to the plane of the plate and parallel to the direction of current flow, and an intermediate segment folded so that it lays in a plane substantially parallel to the plane of the plate, so that the depth of the cavity is advantageously reduced, therefore allowing a larger aperture.

In a further alternative embodiment, not shown, the current recirculating loops are formed by a conducting or superconducting wire.

Further, equally possible embodiments comprise a single, median current recirculating path, or a single current recirculating path placed at a side of the plate in an asymmetric configuration.

In general it is preferable that both current recirculating paths L lie on planes (or surfaces) orthogonal to the plane of the plate and parallel to its sides. Said paths can be circular or polygonal, or disposed along the lines more suitable to generate an additional contribution to the total magnetic field in the region of interest.

Even the rectangular shape of the plate is merely indicative, as other shapes can be considered, polygonal or more complex with curved sides, provided that said shapes are symmetric about a longitudinal median plane, as well as non-plane surfaces obtainable by curving the plate around an axis parallel to the current flow direction.

In general, by plate in the following we mean any substantially two-dimensional, simple or composite structure, adapted to carry a wide, two-dimensional distribution of electric current, for example obtainable by placing conducting wires or webs side by side.

Advantageously, the source 10 includes also a layer of ferromagnetic material associated to the surface of the plate facing opposite to the magnet cavity, so that the field intensity generated inside the cavity is doubled.

The second magnetic field source 12 is formed by a C-shaped magnetic body 40, having a prismatic shape symmetric about the yz plane of symmetry shared with source 10. The C-shaped magnetic body 40 is formed by a volume of magnetized or magnetic material with which a configuration of coils is associated, which encloses the first magnetic field source 10, and whose pole pieces lie in the planes defined by the current recirculating loops 30.

This source is arranged to generate a compensating magnetic field component, oriented in a direction corresponding to the main magnetic field generated by the first source, and having an intensity gradient perpendicular to the conducting plate, adapted to compensate, in the region of interest, the opposite intensity gradient of the field generated by said first source. The known art describes the use of C-shaped magnets for MRI applications (e.g. in U.S. Pat. Nos. 5,592,090 and 5,305,749), but in all these cases the C-shaped magnet is the sole source of the magnetic field, and the useful field is the nearly uniform field in a suitable region between the pole pieces; on the contrary, in this invention the useful field of the C-shaped magnet is the stray, highly non-uniform field, whose gradient is opposite to the gradient of the field generated by the first source.

Figure 3:
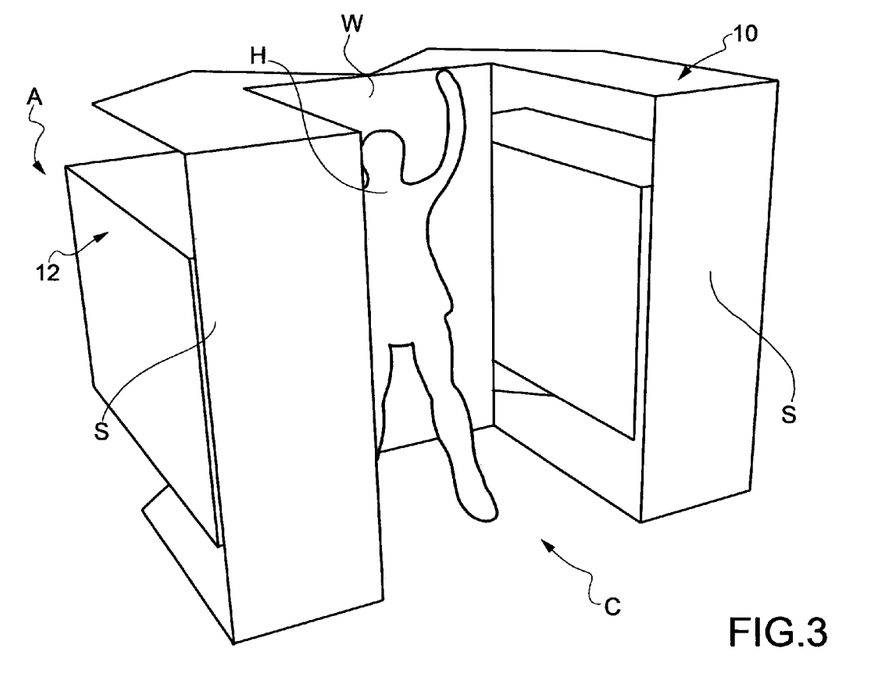
FIG. 3 is a sketched representation of an equipment for magnetic resonance imaging using a magnetic assembly according to the invention.

FIG. 3 shows a schematic representation of the use of a magnetic assembly of the type shown in FIG. 1 or 2, for the implementation of an equipment A suitable for magnetic resonance imaging.

The structure of the first field source 10 constitutes a back wall W of the equipment at the conductive plate, and side walls S at the current closing path loops. The structure of the second field source 12 surrounds trasversely the back wall W and the side walls S, leaving an open space volume C accessible from three sides.

As it can be clearly understood, a patient H can be accommodated in the easily accessible cavity C of the assembly, and positioned in the region of interest close to the back wall where he or she can be subjected to a homogeneous magnetic field over the entire volume to be analyzed. The patient can be positioned in the cavity in a seated or standing position, and can enjoy some (although limited) freedom of movement.

An analysis of the magnetic behaviour of the magnetic assembly according to the invention can be carried out, starting from a set of theoretical considerations and mathematical models, and is provided in the following part of the description.

We start from the consideration that the efficiency of a magnetic structure formed by electrical current conductors, i.e. the field intensity for a given current density, is higher close to a wall of the structure, as is the case for three-dimensional closed structures such as e.g. a solenoid. Now let's consider a two-dimensional conducting structure, such as an infinite conducting strip (current strip) schematically shown in FIG. 4a, having a finite width w, said strip carrying a current I along the longitudinal direction.

Figure 4A:
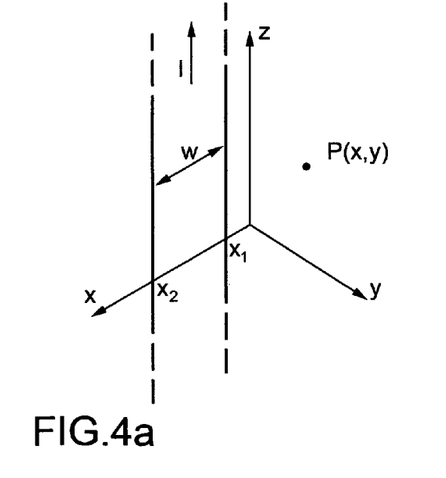
FIGS. 4a and 4b show respectively a geometrical sketch of an infinite current sheet and a diagram of the behaviour of a component of the magnetic field generated by said sheet in a direction away from it.

The field generated at a point P(x, y) by a strip lying in the plane xz, extending from $x_1$ to $x_2$, in which a current intensity I is flowing along direction z, can be computed by integrating the expression of the field generated by an infinite current wire.

The field components are:

$$B_x = \frac{\mu_0 j}{2\pi}\left(\arctan\left(\frac{x-x_1}{y}\right) - \arctan\left(\frac{x-x_2}{y}\right)\right)$$

$$B_y = \frac{\mu_0 j}{2\pi}\log\left(\frac{\sqrt{(x-x_1)^2+y^2}}{\sqrt{(x-x_2)^2+y^2}}\right)$$

Figure 4B:
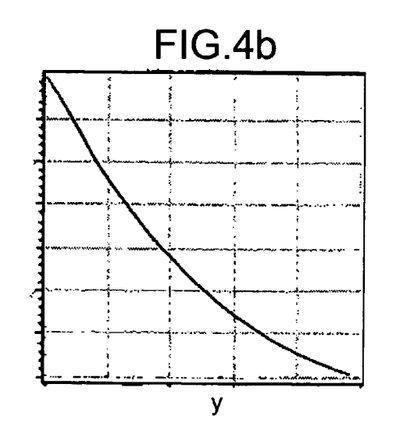

If we analyze the properties of the conducting strip, we find that the magnetic field component parallel to the strip plane ($B_x$), measured in a median plane perpendicular to the strip, in the theoretical case of infinite width starts from the value $\mu_0 j/2$, where $\mu_0$ is the vacuum magnetic permeability and j is the linear current density in A/m, at a point infinitely close to the strip surface, then decreases according to the law $$B_x = \frac{\mu_0 j}{\pi}\arctan\left(\frac{w}{2y}\right)$$

as the distance y from the strip increases (as shown in FIG. 4b).

The orthogonal component $B_y$, on the other hand, vanishes, i.e. $B_y=0$.

For a strip having a finite width w, the field and its gradient in the median plane yz can be expressed as:

$$B_x = \frac{\mu_0 j}{\pi} \arctan\left(\frac{1}{2\eta}\right),$$

$$B_y = 0$$

$$\frac{\partial B_x}{\partial y} = -\frac{\mu_0 j}{2\pi w \eta^2} \frac{1}{\left(1 + \frac{1}{4\eta^2}\right)}$$

Where $\eta = y/w$ represents a normalized distance from the strip.

At a distance from the strip equal to 30% of the width of said strip, the magnetic field component parallel to the plane of the strip has a value of about 0.3 $\mu_0 j$, i.e. about 60% of the field value in an infinite solenoid carrying the same current density. The same field intensity would be generated at the center of a solenoid with a length of 0.8 times its diameter, but this structure would exhibit an aperture factor of 0.3753 only, while an infinite strip achieves a corresponding aperture factor of about 0.83. The greater efficiency of the current strip in these conditions is therefore evident.

However, an infinite current strip is a theoretical structure which cannot be implemented in practice. The closest approximation to this structure (neglecting for the time being the condition of current continuity) is an isolated current strip segment, having a finite length l in the direction of the current flow, as shown in FIG. 5, and defined in the following as a current sheet and obtainable in practice in the form of a conducting or superconducting plate.

Applying the Biot-Savart law to the isolated current sheet structure having unit length and width, we get complex mathematical expressions, here not reported, but in the reach of a person skilled in the art; these expressions yield a value of 0.26 $\mu_0 j$ for the magnetic field component parallel to the sheet plane, very close to the value for the theoretical case of infinite length. The aperture factor in this case is 0.7370.

In practice, the circuit represented by the current sheet must be closed to comply with the current continuity conditions, and a possible advantageous implementation is shown in the same FIG. 5, where the current paths are represented by unidimensional conducting structure models. The additional current paths reduce the aperture factor of the overall structure, but at the sime time contribute positively to the field intensity in the region of interest. In fact, the contributions to the field by the segments of the current closing paths amount to the generation of a field intensity approximately equivalent to the field intensity generated by the main current sheet. Instead, the contribution to the field from the segments connecting the current sheet and the current closing paths can be considered negligible, due to the orientation of the corresponding current flow.

The result for a cubic structure (l=w=a) is a field intensity of about 0.41 $\mu_0 j$ with an aperture factor 0.5 and free access to the magnet cavity from three sides.

The aspect ratio of the current sheet, as well as the size of the current strips forming a closed current path in combination with said sheet, determine a field intensity substantially uniform on planes parallel to the current sheet, but exhibiting a substantial gradient in a direction perpendicular to said sheet.

As an example, a structure having l=1.5 w and a=1.5 w would generate a field intensity equal to 0.52 $\mu_0 j$ with an aperture factor 0.2873.

The gradient is corrected by adding a gradient of opposite sign, such as, for example, the stray field from a C-shaped magnet whose pole pieces lie in the same plane as the current closing paths.

Figure 6:
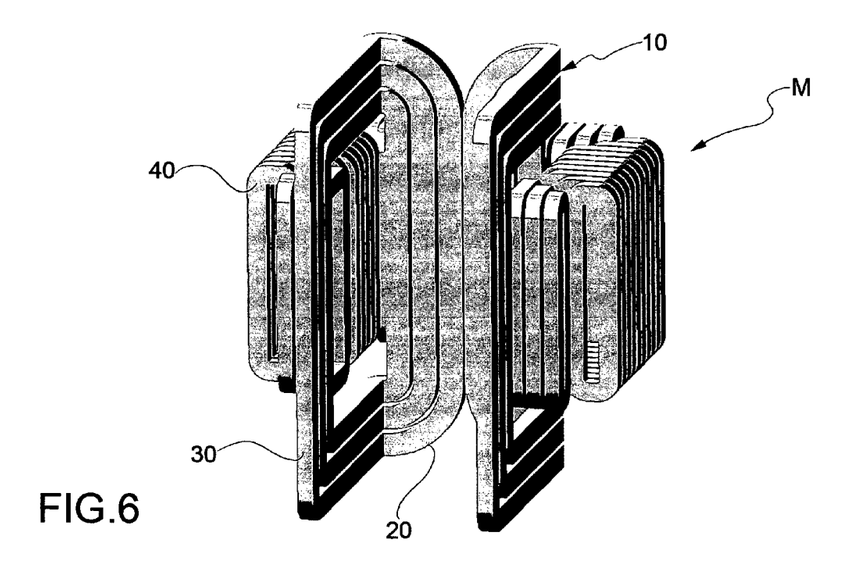
FIG. 6 is a realistic representation of a structure of the magnetic assembly according to the invention; and Figures from 7 to 10 show diagrams of the magnetic field generated by the magnetic assembly shown in FIG. 6 and by the individual magnetic structures forming said assembly.

A mathematical simulation of the described magnetic assembly, related to a realistic implementation design shown in FIG. 6, has been carried out in view of building a scanning equipment for MRI, devoted to the study of the motor cortex of a subject.

In the embodiment of FIG. 6, the first field source 10 includes a plurality of conducting or superconducting webs, placed adjacent to one another in a central portion corresponding to an intermediate straight segment so as to form the current plate structure 20, said webs being then separated into two subsets of adjacent webs, each of them forming a current recirculating path 30.

The cavity of the magnetic complex at the level of the coils, i.e. neglecting the volume of the cryostat (which decreases the actual cavity size by at least 10 cm at each side) exhibits depth, height and width of about 1.0×1.5×1.0 m³. The target field intensity of 1.5 Tesla is achieved by a current density of 27×10⁶ A/m² in the main structure and of 35×10⁶ A/m² in the coils of the compensating structure, obtained by means of a current intensity of 400 A in a 2.3 mm diameter Nb—Ti cable.

The field homogeneity so achieved is about 5700 ppm at the surface of a 150 mm diameter sphere, the total energy stored in the coils is about 10 MJ and the total inductance is 130 H.

It is possible to include additional side correction coils, located at the parallel faces of the cavity, adapted to perturb the generated field to compensate possible dishomogeneities due to remaining errors and manufacturing tolerances.

Figure 7:
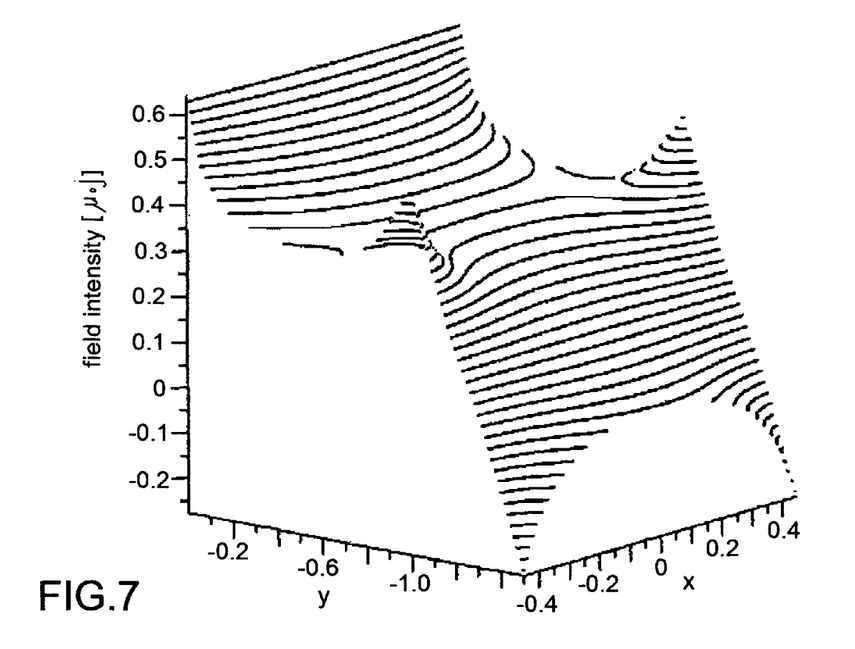
Figure 8:
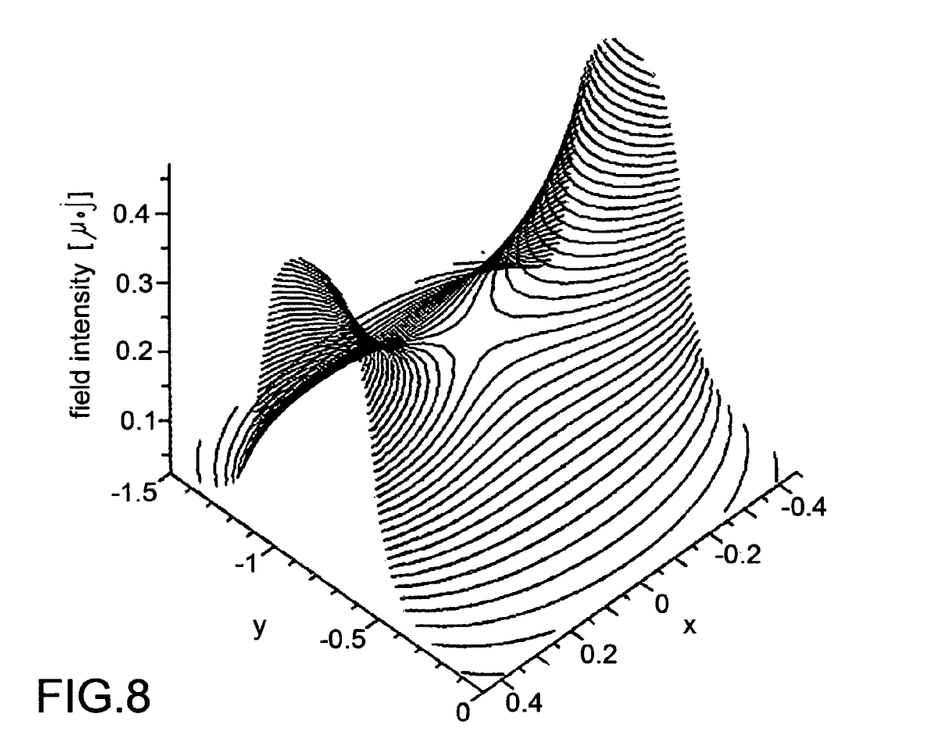

The diagrams in FIGS. 7 and 8 show the intensity of the component $B_x$ of the magnetic field in the plane yz, respectively generated by the first and by the second field source.

Figure 9:
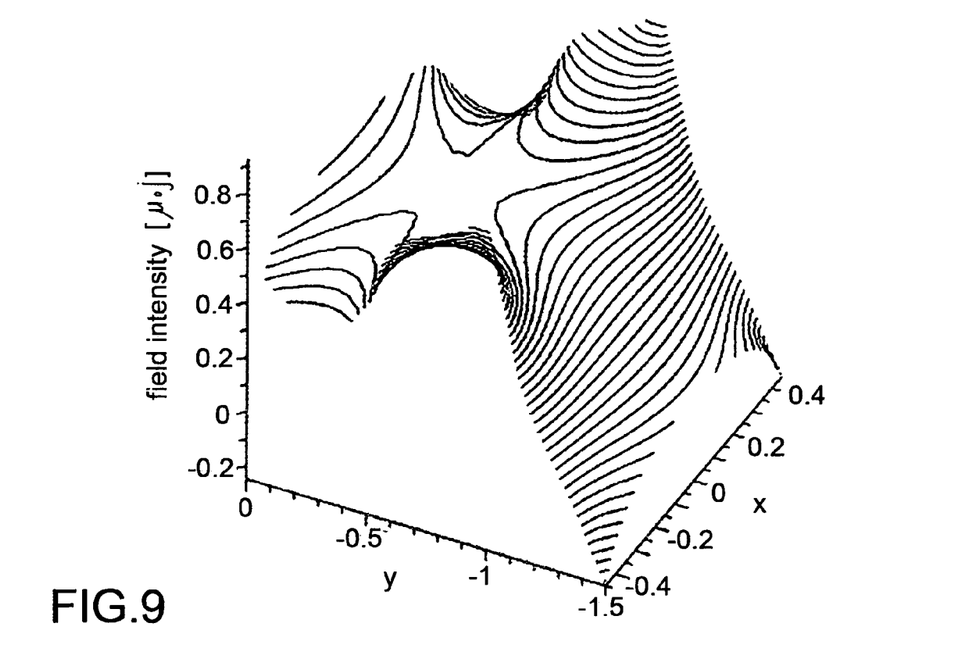
Figure 10:
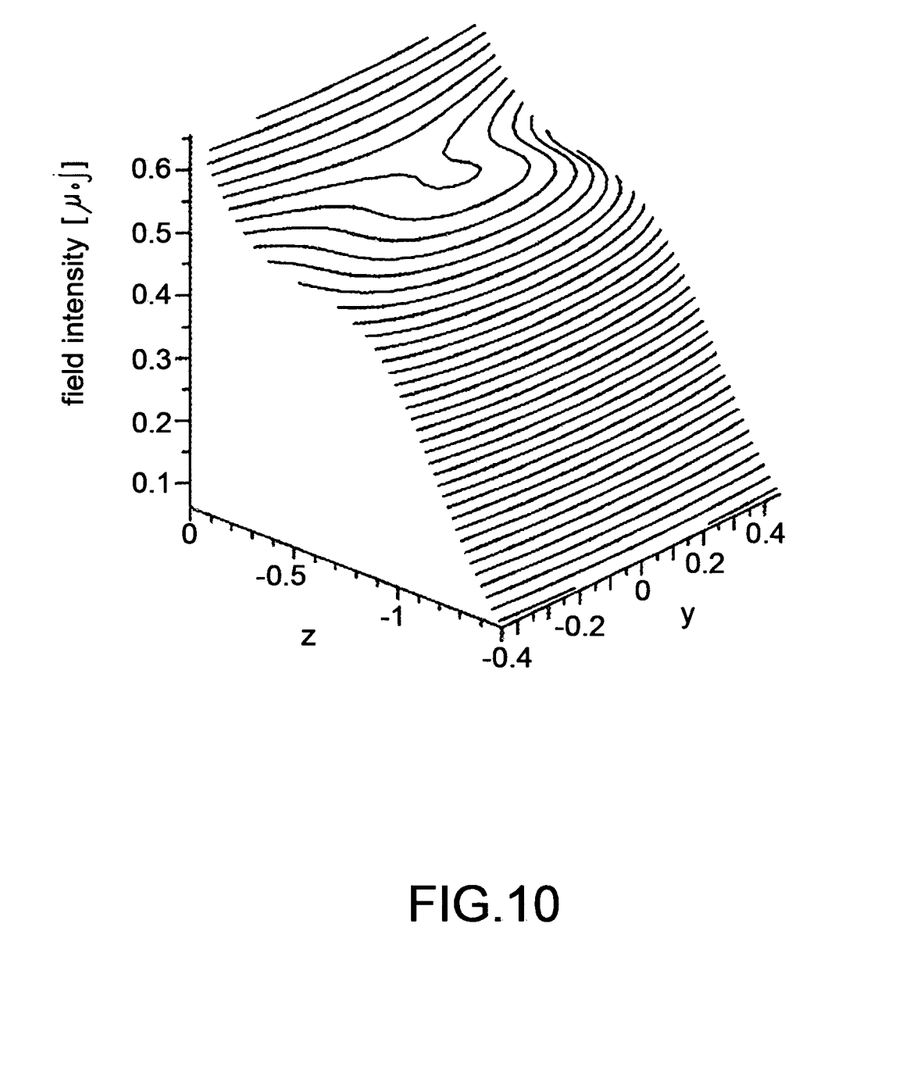

The resultant of the two fields is shown in FIG. 9, where one can clearly see the region of homogeneous field around a saddle point with a derivative order 2, and in the diagram of FIG. 10.

An additional effect of the C-shaped magnet, compensating the main magnetic field generated by the conducting structure according to the invention, is the increase of the field intensity in the region of interest, thereby achieving the result of generating a uniform field in an open magnet structure without decreasing the efficiency, as is instead the typical case when the compensation of field variations is obtained by combining opposing magnetic fields, i.e. by subtracting the magnetic field intensities.

The invention claimed is:

1. An open-structure magnetic assembly adapted to generate a homogeneous magnetic field in an accessible space region, comprising a first source of magnetic field and a second independent source of magnetic field, which define a magnet cavity open on at least one side, and each of the first source and the second source generating a contribution to the resulting magnetic field;

the first source of magnetic field comprises a conducting or superconducting plate, adapted to propagate a unidirectional current flow from an input side to an output side along a longitudinal direction, and to generate in the spatial volume facing the plate a first substantially unidirectional magnetic field oriented along a direction parallel to the plate and perpendicular to the longitudinal direction of said unidirectional current flow, and a pair of external current recirculating paths between the output side and the input side of said plate, for recirculating the current flowing along the plate, arranged symmetrically with respect to a longitudinal median plane of the plate and each of the current recirculating paths connected between a respective segment of the current output edge and a respective segment of the current input edge of the plate; wherein said current recirculating paths comprise a pair of closing loops for current, formed by a conducting or superconducting web, each of the loops comprising an initial segment and a terminal segment lying in a plane perpendicular to the plane of the plate and parallel to the direction of current flow, and an intermediate segment folded so that the intermediate segment lies in a plane substantially parallel to the plane of the plate; and the second source of magnetic field comprises a volume of magnetized material or an arrangement of coils, arranged for generating a second magnetic field component oriented according to the first magnetic field generated by said first source, and whose intensity exhibits a gradient in a direction perpendicular to the conducting plate adapted to compensate, in a region of interest within the spatial volume region facing the plate and included in the magnet cavity, an opposite gradient in the magnetic field intensity generated by said first source.

2. A magnetic assembly according to claim 1, wherein said current recirculating paths lie in a respective plane orthogonal to the plane of the plate.

3. A magnetic assembly according to claim 1, wherein said current recirculating paths comprise a pair of closing loops for current, formed by a conducting or superconducting web, entirely lying in a plane orthogonal to the plane of the plate and parallel to the direction of current flow.

4. A magnetic assembly according to claim 1, wherein said current recirculating paths comprise a pair of closing loops for current formed by a conducting or superconducting web lying on a cylindrical surface having an axis parallel to an axis of the plate perpendicular to the current flow.

5. A magnetic assembly according to claim 1, wherein the conducting or superconducting plate is curved around an axis parallel to the flow of current.

6. A magnetic assembly according to claim 1, wherein the first source of magnetic field comprises a layer of ferromagnetic material associated with the surface of the conducting or superconducting plate, and placed on the side opposite to the magnet cavity.

7. A magnetic assembly according to claim 1, wherein the second source of magnetic field comprises a C-shaped magnetic body, surrounding the first source of magnetic field, and whose pole pieces lie substantially in the planes of the current recirculating paths.

8. Apparatus for magnetic resonance imaging (MRI), comprising a magnetic assembly according to claim 1.

* * * * *